United States Patent
Betrabet

(10) Patent No.: US 7,247,564 B2
(45) Date of Patent: Jul. 24, 2007

(54) ELECTRONIC DEVICE

(75) Inventor: Chinmay S. Betrabet, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 299 days.

(21) Appl. No.: 10/880,299

(22) Filed: Jun. 28, 2004

(65) Prior Publication Data

US 2005/0287805 A1 Dec. 29, 2005

(51) Int. Cl.
 *H01L 21/44* (2006.01)
(52) U.S. Cl. .................... 438/679; 359/290
(58) Field of Classification Search ........... 438/679, 438/690, 694, 751, 754; 359/290, 295, 315, 359/846
See application file for complete search history.

(56) References Cited

U.S. PATENT DOCUMENTS

| | | | |
|---|---|---|---|
| 3,918,625 A | 11/1975 | Nippert | |
| 4,323,419 A | 4/1982 | Wakefield | |
| 4,632,557 A * | 12/1986 | Thompson | 356/401 |
| 5,857,368 A | 1/1999 | Grunes et al. | |
| 5,891,795 A | 4/1999 | Arledge et al. | |
| 5,908,316 A | 6/1999 | Le et al. | |
| 5,985,194 A | 11/1999 | Kadooka et al. | |
| 6,140,235 A | 10/2000 | Yao et al. | |
| 6,242,156 B1 * | 6/2001 | Teng | 430/270.1 |
| 6,316,279 B1 | 11/2001 | Tauchi et al. | |
| 2002/0185735 A1 | 12/2002 | Sakurai et al. | |
| 2003/0054626 A1 | 3/2003 | Kobayashi et al. | |
| 2004/0156108 A1 * | 8/2004 | Chou et al. | 359/566 |

FOREIGN PATENT DOCUMENTS

| | | |
|---|---|---|
| JP | 11135848 | 5/1999 |
| JP | 11186622 | 7/1999 |
| JP | 11329100 | 11/1999 |
| JP | 2000124512 | 4/2000 |
| JP | 2003117459 | 4/2003 |

OTHER PUBLICATIONS

JP10125952, May 15, 1998, Kobayashi Kazuhiro et al.
JP7321181, Dec. 8, 1995, Sekiya Kazuma.

* cited by examiner

*Primary Examiner*—Phuc T. Dang

(57) ABSTRACT

One embodiment of a method of making an electronic device includes forming on a substrate surface a first layer having a peak-valley-peak profile, and forming a second layer on the first layer by use of a target positioned along a line-of-sight that excludes a floor of the valley such that the second layer is not formed on the floor of said peak-valley-peak profile.

25 Claims, 5 Drawing Sheets

ELECTRONIC DEVICE

BACKGROUND

Many commonly used electronic devices such as computers, printers, cameras, hand-held electronic date books, microwave ovens, and the like, may include electronic components. Manufacturing electronic components having relatively high material costs, a relatively large number of processing steps, a relatively slow throughput of the process, and relatively high processing temperatures, may limit the usefulness of some types of electronic components.

DETAILED DESCRIPTION OF THE DRAWINGS

Figure 1:
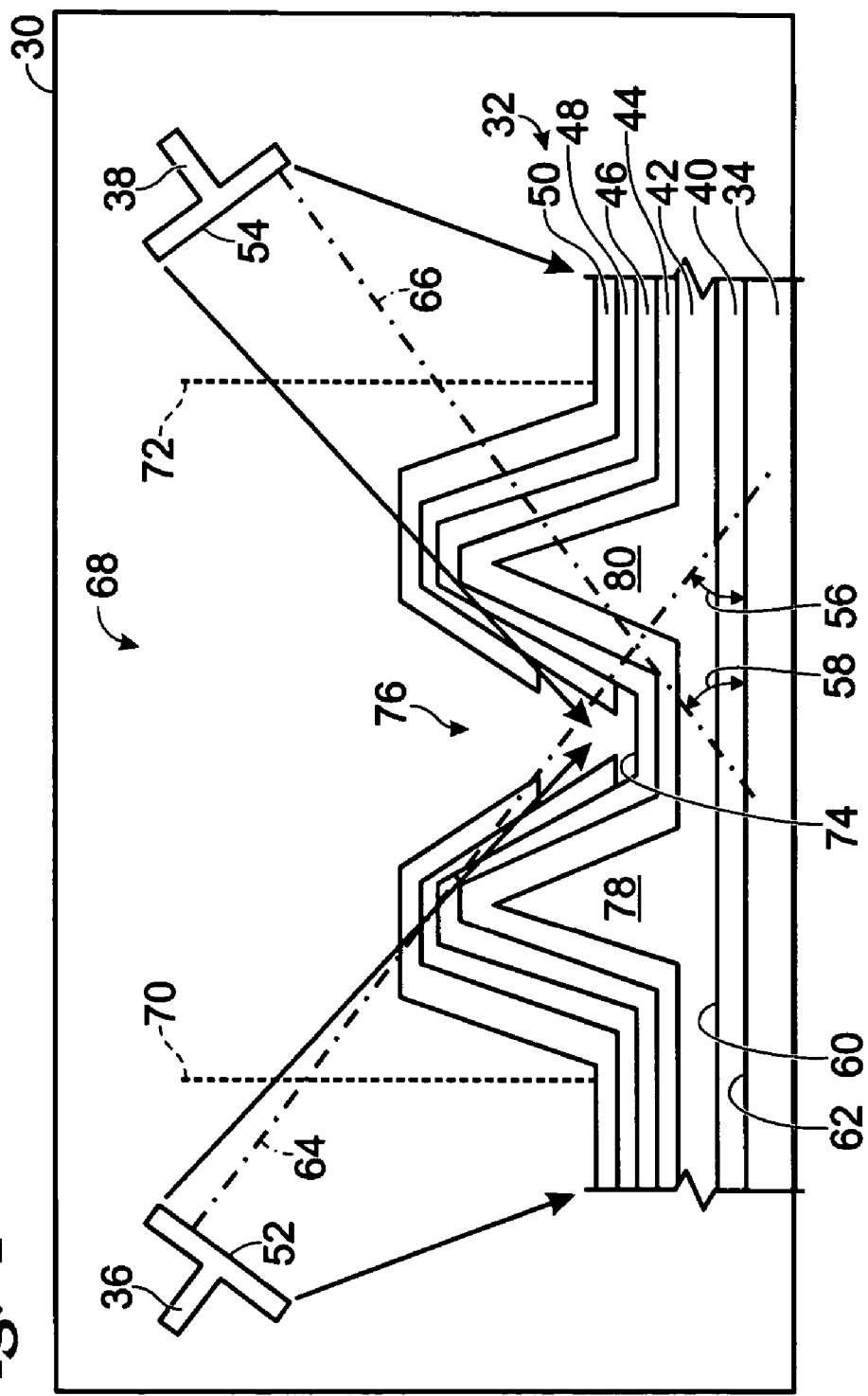
FIG. 1 is a schematic of one embodiment of a deposition chamber for fabricating one embodiment of an electronic device.

FIG. 1 is a schematic of one embodiment of a deposition chamber 30 for fabricating one embodiment of an electronic device 32. Chamber 30 may include a substrate holder 34 and first and second targets 36 and 38 positioned thereabove. A substrate 40 may be positioned on holder 34 and may include, for example, a base layer 42, first and second additional layers 44 and 46, and third and fourth additional layers 48 and 50. First and second additional layers 44 and 46 may be deposited using a target orientation shown in FIG. 1 such that layers 44 and 46 extend entirely across their immediately underlying layer, namely, layers 42 and 44, respectively. However, targets 36 and 38 may each include a deposition surface 52 and 54, respectively, that are each offset from and positioned at an acute angle 56 and 58, respectively, to an upper surface 60 of substrate 40 and to an upper surface 62 of substrate holder 34. Angles 56 and 58 may each be measured as the arc from upper surface 60 (or from a line parallel to upper surface 60) of substrate 40 to a line 64 and 66, respectively, that extends outwardly and perpendicularly from deposition surfaces 52 and 54, respectively, of targets 36 and 38. Angles 56 and 58 may be any angle within a range of greater than zero degrees and less than ninety degrees, and in some embodiments, within a range of zero to thirty degrees.

Targets 36 and 38 may also be offset from substrate 40, meaning that targets 36 and 38 may each be positioned outwardly of a region 68 in which deposition material may be deposited on substrate 40. In other words, in the example embodiment shown, target 36 may be positioned to the left of dash line 70 which may indicate the left edge of deposition region 68, and target 38 may be positioned to the right of dash line 72 which may indicate the right edge of deposition region 68. Accordingly, the targets might not be positioned directly over substrate 40 during deposition on a material thereon. For purposes of illustration, targets 36 and 38 are shown much closer to deposition region 68 and to dash lines 70 and 72, respectively, than may occur during one embodiment of an actual deposition. Due to the offset and acute angle positioning of targets 36 and 38, with respect to substrate 40, layers deposited on substrate 40 by targets 36, 38 and/or other targets, may be deposited in a "line of sight" region (as will be described in more detail below) such that deposition material is not deposited on a floor 74 of a valley region 76 positioned between dual peaks 78 and 80 of layer 42. For purposes of illustration, first and second peaks 78 and 80 are shown as a component of layer 42. However, the peak-valley-peak profile may be a component of any layer on substrate 40, or a component of substrate 40 itself. Moreover, any number and/or shape of peaks may be utilized as may be desired for a particular application (see FIG. 8).

Figure 2:
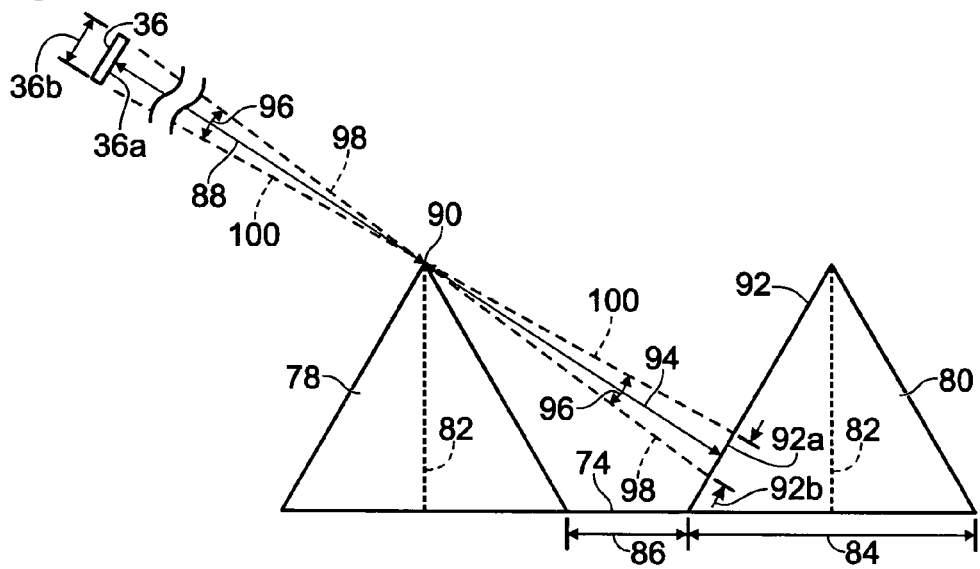
FIG. 2 is a schematic showing one embodiment of a target orientation of one embodiment of a fabrication process.

FIG. 2 is a schematic showing one embodiment of a target orientation of one embodiment of a fabrication process. In particular, first and second peaks 78 and 80 of layer 42 are shown, wherein each of peaks 78 and 80 have a substantially triangular cross section. In the embodiment shown, the peaks may each have a height 82 of approximately 20 microns, a base 84 having a width of approximately 23 microns, and a separation width 86, i.e., a width of floor 74 of valley 76, of approximately 10 microns.

Target 36 may be positioned a distance 88 from an apex 90 of first peak 78, wherein distance 88 may be approximately 30 centimeters (cm). A side surface 92 of second peak 80 may be inclined with respect to base 84 and may be positioned approximately a distance 94 from apex 90 of first peak 78, wherein distance 94 may be approximately 30 microns and may be measured along a line contiguous with distance measurement 88. Surface area 36a of target 36 may be proportional to distance 88 multiplied by an angle 96 which may be measured as an arc extending between lines 98 and 100 that extend from an outer edge of target 36 to apex 90 of first peak 78. Similarly, a deposition surface area 92a on side surface 92 of second peak 80 may be proportional to distance 94 multiplied by angle 96. In particular, a width 92b of deposition surface 92a may be proportional to distance 94 multiplied by a sine of angle 96. Lines 98 and 100 may define the "line of sight" of target 36 over apex 90 and, therefore, define the deposition surface area 92a on peak 80.

In the embodiment shown, distance 88 may be substantially larger than distance 94 such that surface area 36a of target 36 may be four orders of magnitude larger than deposition surface area 92a on side surface 92 of second peak 80. For example, a width 36b of target 36 may be two orders of magnitude larger than a width 92b of deposition surface 92a. Moreover, in an embodiment wherein distance 88 may be substantially larger than distance 94, large changes in the position of target 36 may result in relatively small changes in the position of deposition surface area 92a on side surface 92 of second peak 80. Accordingly, the position of target 36 may be adjusted for a particular size and shape of peaks on substrate 40 such that deposition surface area 92a may cover inclined side surface 92 of second peak 80 but not extend onto floor 74 of valley region 76 between peaks 78 and 80. In other words, the position of target 36 may be adjusted so that the "line of sight" of target 36 is aligned to deposit target material along, or along a portion of, side surface 92 of peak 80 without depositing material on floor 74 of valley 76. In one embodiment, deposition surface area 92a may be contiguous with side surface 92 of peak 80. The position of target 38 (see FIG. 1), or any other target, may be adjusted so that the "line of sight" of target 38 is aligned to deposit target material on a side surface of a peak, such as on a side surface of peak 78, without depositing material on a floor, such as on floor 74, of valley 76. In this manner, deposition material may be selectively deposited on the sides of peaks, or on portions of peaks, without depositing material in a channel or a valley region of an electronic component. For large values of distance 88, relative to distance 94, such as three orders of magnitude or larger, lines 98 and 100 may be substantially parallel to that multiple sets of peaks, i.e., two or more peaks, may be positioned perpendicular to direction 104 (see FIG. 4).

The disclosed process of, therefore, may reduce the number of processing steps used, such as reducing the number of masking and etching steps used, which may reduce the material costs, may reduce the number of processing steps, may increase the throughput of the process, and may increase the process yield. Moreover, reducing or eliminating some of the process steps may allow a process that utilizes less high temperature steps, thereby increasing the number and types of substrates, such as temperature sensitive substrates, that may be utilized for fabricating electronic devices.

FIG. 3 is a schematic of one embodiment of a process flow of fabricating one embodiment of an electronic device. In a first step, shown in FIG. 3A, a peak-valley-peak profile 102 of layer 42 may be deposited on a substrate 40, or on another layer positioned on substrate 40. Layer 42 may be permanently deposited on substrate 40 or removably deposited on substrate 40, in which case substrate 40 may be a temporary substrate for supporting layer 42 until the layer is placed on a more permanent support. Layer 42 may be extruded and may include two peaks, such as peaks 78 and 80, or any number of peaks as may be desirable for a particular application. Each of the peaks may extend along an extrusion direction 104 (shown extending into the page). The peaks may be extruded in any size, shape, number, combination, or spacing as may be desirable for a particular application (see FIG. 8).

Figure 3A:
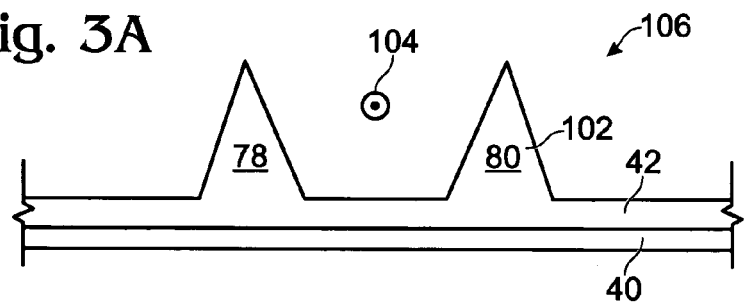
FIG. 3A-3E is a schematic of one embodiment of a process flow of fabricating one embodiment of an electronic device.
Figure 3B:
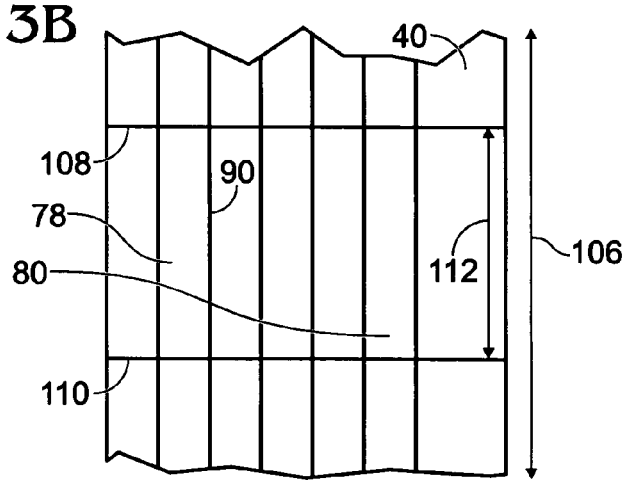

FIG. 3B is a schematic top view of substrate 40 showing two extruded peaks 78 and 80 of layer 42. The peaks may be extruded continuously along a length 106 of substrate 40 or may be extruded along a portion or portions of the length of substrate 40. Layer 42, such as including peaks 78 and 80 of the embodiment shown, may be cut, such as at cuts 108 and 110, after extrusion to define a length 112 of the peaks or the electrical component. In another embodiment, layer 42 may be cut after deposition of subsequent layers thereon. Cuts 108 and 110, and any other number and/or position of cuts that might be made to the peaks and/or the substrate, may be made by any method, such as by a laser, a saw, a blade, or the like.

Figure 3C:
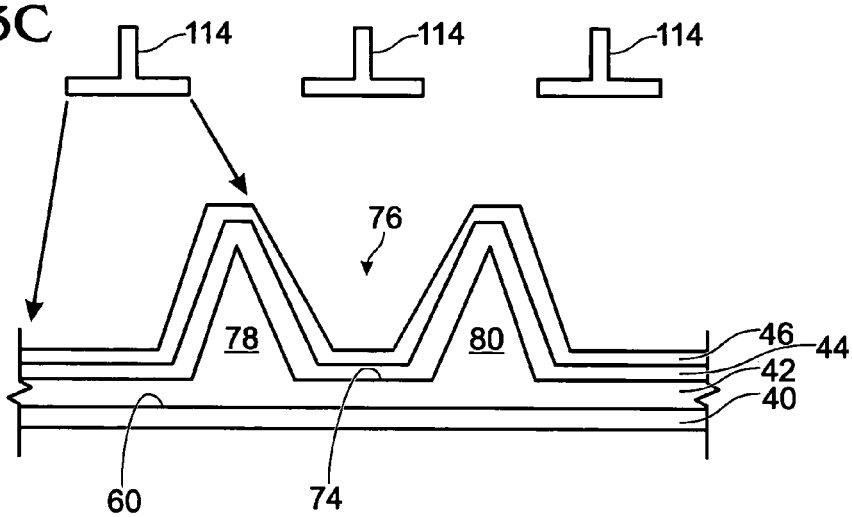

FIG. 3C is a schematic side cross sectional view showing three targets 114 positioned above and parallel to surface 60 of substrate 40 so as to deposit layers 44 and 46 over the entirety of peak-valley-peak profile 102, including deposition on valley floor 74 of valley region 76.

Figure 3D:
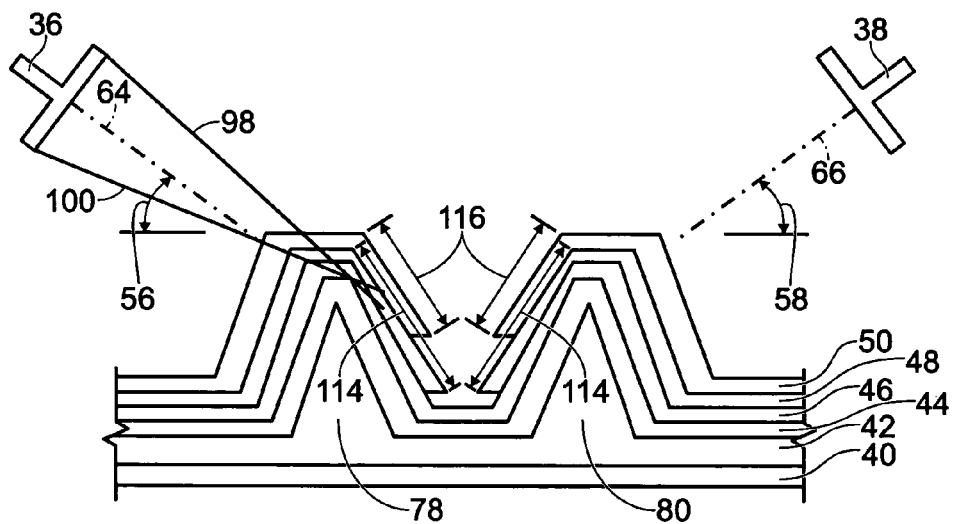

FIG. 3D is a schematic side cross sectional view showing targets 36 and 38 offset from and positioned at acute angles 56 and 58, respectively, to upper surface 60 of substrate 40 or to a line parallel thereto. In one deposition step, layer 48 has been deposited on underlying layer 46 such that a deposition surface area 114 is positioned on a portion of side surface 92 (see FIG. 2) of peaks 78 and 80. In a second deposition step, layer 50 has been deposited on underlying layer 48 such that a deposition surface area 116 is positioned on a portion of side surface 92 of peaks 78 and 80. In the embodiment shown, deposition surface areas 114 and 116 do not extend onto floor 74 of valley 76 such that valley 76 may be utilized as a channel region of a semiconductor electronic device.

Figure 3E:
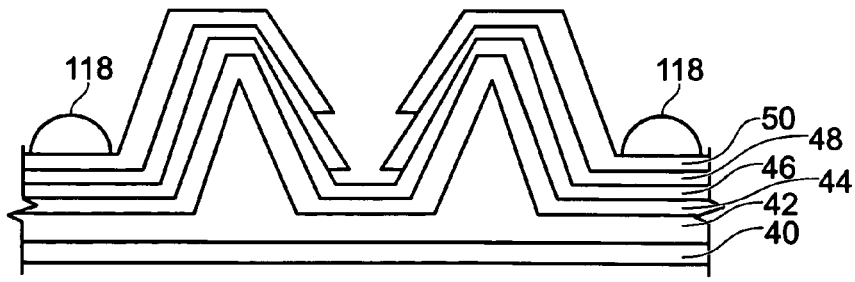

FIG. 3E is a schematic side cross sectional view wherein interconnects 118 are positioned on uppermost layer 50. Interconnects 118 may be conductive material such as metal. In the embodiment shown, layer 42, including peaks 78 and 80 may be a conductor, such as a metal. Layer 44 may be an insulator such as silicon carbide (SiC). Layer 46 may be a semiconductor material, such as n-type polycrystalline silicon. Layer 48 may be a line-of-sight deposition of an ohmic contact layer, such as n+ silicon. Layer 50 may be a line-of-sight deposition of a metal layer, such as aluminum, copper or silver.

In one embodiment, layers 42-50 may be positioned and built up directly on substrate 40. In another embodiment, the layered structure of layers 42-50, or portions thereof, may be built up on another support and then laminated onto substrate 40. The layered structure may be cut along its length, such as at cuts 108 and 110, before or after placement of layers 44-50, or portions thereof, on peak-valley-peak profile 102, and before or after the layered structure is placed on substrate 40.

Figure 4:
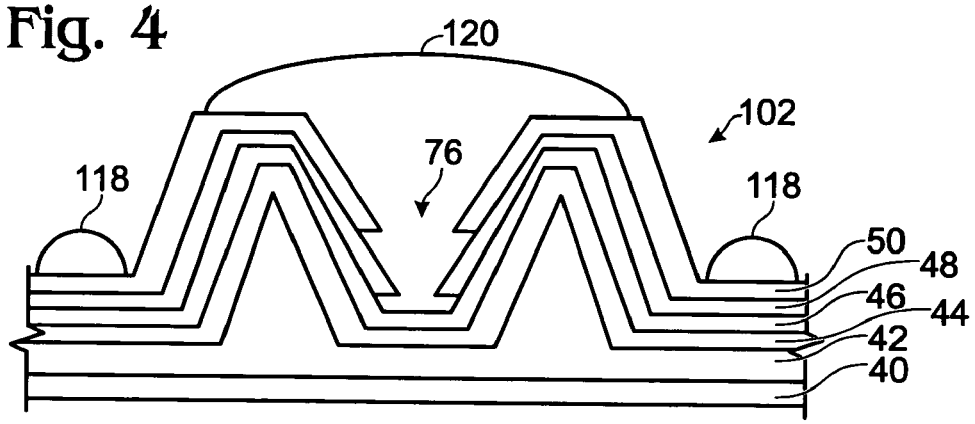
FIG. 4 is a schematic cross-sectional view of one embodiment of a channel semiconductor device.

FIG. 4 is a schematic cross-sectional view of one embodiment of a channel semiconductor device wherein an encapsulant 120 is positioned over valley region 76. Encapsulant 120 may be utilized to protect valley region 76. In this embodiment, the electronic device may comprise a channel semiconductor of n+ silicon. Layer 42 may be metal, layer 44 may be an insulator such as SiC, layer 46 may be a semiconductor material, such as n-type polycrystalline silicon, layer 48 may be an ohmic contact layer, such as n+ silicon, layer 50 may be a metal layer, such as aluminum, copper or silver, and interconnects 118 may be metal. In this embodiment, the peak-valley-peak profile 102 of layer 42 may be manufactured by extrusion and the line-of-sight deposition technique may be utilized to deposit layers 48 and 50.

Figure 5:
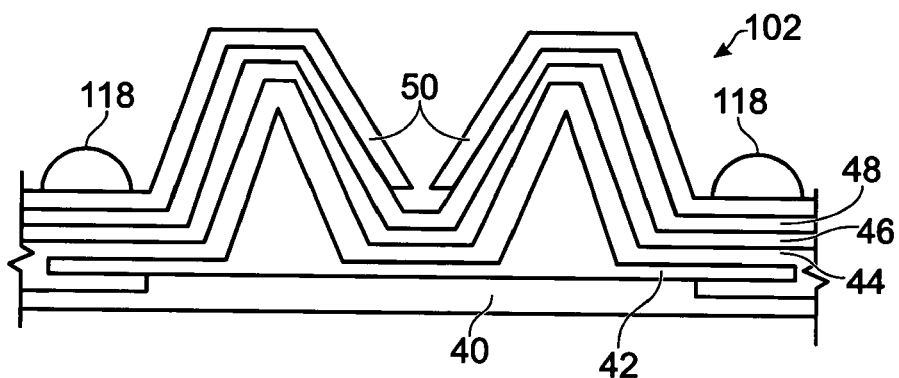
FIG. 5 is a schematic cross-sectional view of one embodiment of a transparent transistor device.

FIG. 5 is a schematic cross-sectional view of one embodiment of a transparent transistor device. In this embodiment, substrate 40 may be glass, layer 42 may be metal, layer 44 may be indium doped tin oxide (ITO), layer 46 may be an insulator, such as SiN, layer 48 may be a channel semiconductor such as ZnO, layer 50 may be ITO, and interconnects 118 may be metal. In this embodiment, the peak-valley-peak profile 102 of layer 42 may be manufactured by extrusion and the line-of-sight deposition technique may be utilized to deposit layers 48 and 50.

Figure 6:
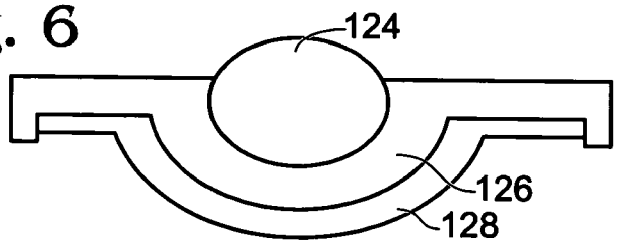
FIG. 6 is a schematic cross-sectional view of one embodiment of a capacitor device.

FIG. 6 is a schematic cross-sectional view of one embodiment of a capacitor device 122. In this embodiment, layer 124 may be manufactured by extrusion wherein layers 126 and 128 may be deposited thereon. Layer 124 may be a conductor such as a metal or a conductive oxide such as ITO or zinc tinoxide. Layer 126 may be an insulator, such as an organic insulator or an inorganic insulator. Layer 128 may be a conductor such as a metal or a conductive oxide such as ITO or zinc tinoxide.

Figure 7:
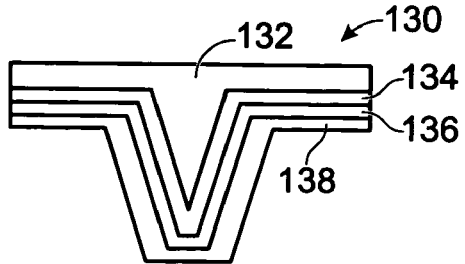
FIG. 7 is a schematic cross-sectional view of one embodiment of a diode device.
Figure 8A:
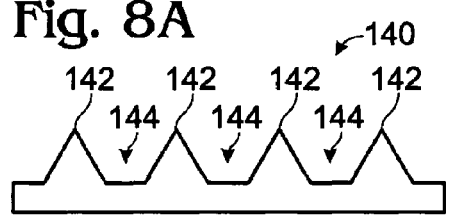
FIG. 8 is a schematic cross-sectional view of several embodiments of peak-valley-peak profiles that may be utilized in different embodiments of the fabrication process.
Figure 8D:
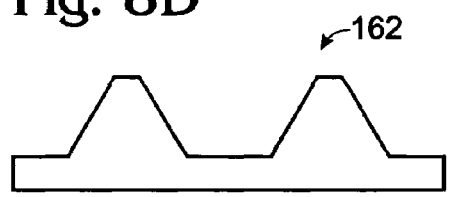
Figure 8B:
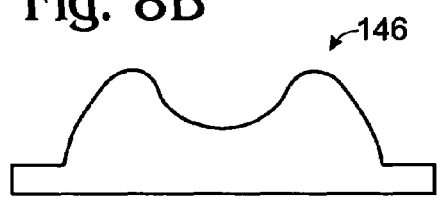
Figure 8E:
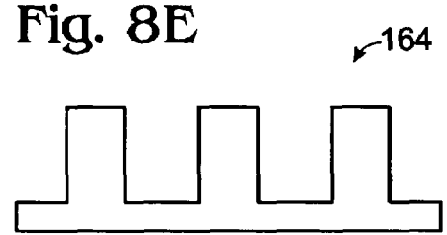
Figure 8C:
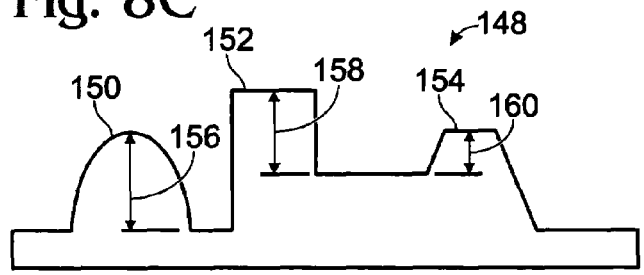

FIG. 7 is a schematic cross-sectional view of one embodiment of a diode device 130. In this embodiment, layer 132 may be manufactured by extrusion wherein layers 134, 136 and 138 may be deposited thereon. Layer 132 may be metal, layer 134 may be n-type silicon, layer 136 may be p-type silicon, and layer 138 may be metal.

FIG. 8 is a schematic cross-sectional view of several embodiments of peak-valley-peak profiles that may be utilized in different embodiments of the fabrication process. FIG. 8A is schematic triangular peak profile 140 including four peaks 142 and three valley regions 144. The term "peak-valley-peak" profile is defined to means any profile having at least two peaks with at least one valley region positioned therebetween. FIG. 8B is a schematic sinusoidal wave profile 146. FIG. 8C is a schematic multi-bump profile 148 wherein bumps 150, 152 and 154 have different shapes and heights 156, 158 and 160, respectively. FIG. 8D is a schematic truncated triangle profile 162. FIG. 8E is a schematic square wave profile 164.

Figure 9:
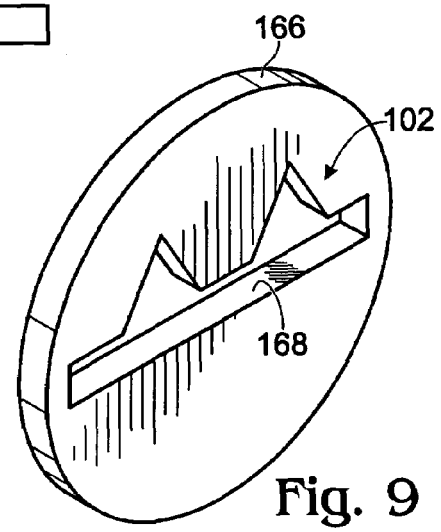
FIG. 9 is a schematic of one embodiment of a die for extruding one embodiment of a peak-valley-peak profile.

FIG. 9 is a schematic of one embodiment of a die for extruding one embodiment of a peak-valley-peak profile 102. Die 166 may include an aperture 168 extending therethrough wherein aperture 168 may have a shape of a peak-valley-peak profile 102.

Other materials, formation and application techniques may be utilized wherein such variations and modifications of the concepts described herein fall within the scope of the claims below.

I claim:

1. A method of making an electronic device, comprising:
   forming on a substrate surface a conductive layer having a peak-valley-peak profile; and
   forming an ohmic layer on said conductive layer by use of a target positioned along a line-of-sight that excludes a floor of said valley such that said ohmic layer is not formed on said floor of said peak-valley-peak profile.

2. A method according to claim 1 wherein said target includes a deposition surface positioned non-parallel to said floor.

3. A method according to claim 1 wherein said peaks each includes an inclined side surface, wherein said ohmic layer is formed on at least a portion of said inclined side surface of each peak.

4. A method according to claim 3 wherein said portion of said side surface of said peak defines a peak deposition surface, wherein said target includes a target deposition surface, and wherein a width of said target deposition surface is at least three orders of magnitude greater than a width of said peak deposition surface.

5. A method according to claim 4 wherein said peak deposition surface width is in a range of 10 to 50 microns, and wherein said target deposition surface width is in a range of 10 to 50 centimeters.

6. A method according to claim 3 wherein a distance from an apex of one of said peaks to an inclined side surface of a second of said peaks defines a first distance, and wherein said apex of one of said peaks to a deposition surface of said target defines a second distance, and wherein said second distance is at least three orders of magnitude greater than said first distance.

7. A method according to claim 6 wherein said first distance has a length in a range of 10 to 50 microns, and wherein said second distance has a length in a range of 10 to 50 centimeters.

8. A method according to claim 1 wherein said target includes a deposition surface that defines first and second target edge extension lines that pass through an apex of a first one of said peaks to define first and second edges of a deposition region on a second one of said peaks.

9. A method according to claim 8 wherein said first and second target edge extension lines define an angle therebetween, wherein a width of said target deposition surface is approximated by a length of said first and second edge extension lines to said apex multiplied by the sine of said angle.

10. A method according to claim 1 wherein said forming said conductive layer comprises a process chosen from the group consisting of extruding, laminating, sputtering, stamping, physical vapor deposition, and chemical vapor deposition.

11. A method according to claim 1 wherein said conductive layer is metal and wherein said ohmic layer is N+ silicon.

12. A method according to claim 1 further comprising forming a third layer on said ohmic layer by use of a target positioned along a second line of sight that excludes a floor of said valley such that said third layer is not formed on said floor.

13. A method according to claim 1 wherein said peak-valley-peak profile comprises a shape chosen from the group consisting of a triangular peak profile, a sinusoidal wave profile, a multi-bump profile, a truncated triangle profile, and a square wave profile.

14. A method according to claim 1 further comprising forming said ohmic layer on said peaks by use of a second target positioned along a second line of sight opposed to said first line of sight, wherein said second line of sight excludes said floor of said valley such that said ohmic layer is not formed on said floor.

15. A method according to claim 3 wherein said peaks each include a second inclined side surface that extends upwardly to an apex of said peaks, and wherein said ohmic layer is deposited on at least a portion of said second inclined side surface of each peak.

16. A method according to claim 1 wherein said floor comprises a channel of said electronic device.

17. An electronic device manufactured by a process comprising:
    forming on a substrate surface a metal base layer having multiple peaks; and
    forming an ohmic contact layer on selected portions of said metal base layer by use of a target positioned along an axis non-perpendicular to said substrate surface such that said ohmic contact layer does not extend onto a floor region positioned between said multiple peaks.

18. An electronic device according to claim 17 further comprising forming a metal contact layer on selected portions of said ohmic contact layer by use of a target positioned along an axis non-perpendicular to said substrate surface such that said metal contact layer does not extend onto said floor region between said multiple peaks.

19. An electronic device according to claim 17 wherein said metal base layer comprises copper.

20. An electronic device according to claim 17 wherein said ohmic contact layer comprises N+ silicon.

21. An electronic device according to claim 17 wherein said metal contact layer comprises a metal chosen from the group consisting of aluminum, copper and silver.

22. An electronic device according to claim 17 wherein said substrate is chosen from one of a polycarbonate, a polyester, a polyimide, a polyamide, a polyacrylate, a polyalkane, glass, alumina and tantalumoxide.

23. An electronic device according to claim 17 wherein said forming said metal base layer is chosen from the group consisting of stamping, extruding, sputtering, chemical vapor deposition (CVD), lamination, and physical vapor deposition (PVD).

24. An electronic device according to claim 17 wherein said electronic device is a transistor.

25. A method of manufacturing an electronic device, comprising:

step for depositing a conductive layer having a peak-valley-peak profile; and in an absence of masking a valley floor of said peak-valley-peak profile, step for depositing an ohmic layer on said conductive layer excluding a valley floor of said peak-valley-peak profile.

* * * * *